United States Patent
Onishi et al.

(10) Patent No.: US 8,304,812 B2
(45) Date of Patent: Nov. 6, 2012

(54) TERAHERTZ WAVE RADIATING ELEMENT

(75) Inventors: Toshikazu Onishi, Osaka (JP); Tatsuya Tanigawa, Osaka (JP); Shinichi Takigawa, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/051,455

(22) Filed: Mar. 18, 2011

(65) Prior Publication Data

US 2011/0204418 A1    Aug. 25, 2011

Related U.S. Application Data

(63) Continuation of application No. PCT/JP2010/005201, filed on Aug. 24, 2010.

(30) Foreign Application Priority Data

Feb. 24, 2010   (JP) ................................ 2010-038842

(51) Int. Cl.
*H01L 29/778* (2006.01)
(52) U.S. Cl. . 257/194; 257/184; 257/192; 257/E29.246; 257/E31.001
(58) Field of Classification Search .................. 257/194
See application file for complete search history.

(56) References Cited

U.S. PATENT DOCUMENTS

| | | | |
|---|---|---|---|
| 7,250,642 B2 * | 7/2007 | Masumoto et al. | 257/192 |
| 7,465,967 B2 * | 12/2008 | Smith et al. | 257/194 |
| 2004/0124435 A1 | 7/2004 | D'evelyn et al. | |
| 2009/0090984 A1 * | 4/2009 | Khan et al. | 257/409 |

FOREIGN PATENT DOCUMENTS

| | | |
|---|---|---|
| JP | 01-179490 | 7/1989 |
| JP | 2006-513122 | 4/2006 |
| JP | 2006-237313 | 9/2006 |
| JP | 2009-224467 | 10/2009 |
| WO | WO 2006/030608 A1 | 3/2006 |

OTHER PUBLICATIONS

M. Ortolani et al., "Detection of terahertz radiation by AIGaN/GaN field-effect transistors", Sep. 2009; Publication from the 34th International Conference on Infrared, Millimeter, and Terahertz Waves.*
N. Dyakonova, et al., "Room-temperature terahertz emission from nanometer filed-effect transistors", Applied Physics Letter, 2006, vol. 88 No. 141906, American Institute of Physics.
A. Torabi, et al., "Planar Grid Oscillators for Quasi-Optical Power Combining at 37GHz", Proceedings of Foruth International Symposium on Space Terahertz Technology, 1993, pp. 80-93.

(Continued)

*Primary Examiner* — Jerome Jackson, Jr.
*Assistant Examiner* — David Spalla
(74) *Attorney, Agent, or Firm* — McDermott Will & Emery LLP

(57) ABSTRACT

A terahertz wave radiating element includes: a first nitride semiconductor layer formed on a substrate; a second nitride semiconductor layer formed over the first nitride semiconductor layer, and having a wider bandgap than the first nitride semiconductor layer; and source, gate, and drain electrodes formed on the second nitride semiconductor layer. The source electrode is formed by a plurality of source electrode fingers that are arranged periodically, and the drain electrode is formed by a plurality of drain electrode fingers that are arranged periodically.

18 Claims, 8 Drawing Sheets

OTHER PUBLICATIONS

S. A. Mikhailov, "Plasma instability and amplification of electromagnetic waves in low-dimensional electron systems", Physical Review B, 1998, vol. 58 No. 3, pp. 1517-1532, The American Physical Society.

T. Otsuji, et al., "Grating-bicoupled Plasmon-resonant terahertz emitter fabricated with GaAs-based heterostructure material systems", Applied Physics Letters, 2006, vol. 89 263502, American Institute of Physics.

M. Dyakonov, et al., "Shallow Water Analogy for a Ballistic Field Effect Transistor: New Mechanism of Plasma Wave Generation by dc Current", Physical Review Letter, Oct. 11, 1993, vol. 71 No. 15, pp. 2465-2468, The American Physical Society.

* cited by examiner

TERAHERTZ WAVE RADIATING ELEMENT

CROSS-REFERENCE TO RELATED APPLICATION

This is a continuation of PCT International Application PCT/JP2010/005201 filed on Aug. 24, 2010, which claims priority to Japanese Patent Application No. 2010-038842 filed on Feb. 24, 2010. The disclosures of these applications including the specifications, the drawings, and the claims are hereby incorporated by reference in their entirety.

BACKGROUND

A technique disclosed in the present invention relates to semiconductor elements as terahertz wave radiating elements capable of radiating electromagnetic waves in a terahertz frequency band.

Electromagnetic waves in the terahertz band show transparency of radio waves as well as the broadband property, coherence, and concentrating property of light, and have been expected to be applied to various fields such as security, biology, environment, and communication. Photoconductive elements, terahertz parametric generators, quantum cascade lasers, carbon dioxide lasers, backward wave oscillators, etc. have been used as devices for radiating terahertz electromagnetic waves. However, currently, it is difficult to reduce the size and prices of such devices because they require a large-scale, expensive femtosecond laser or picosecond laser, and need to be cooled to a very low temperature when operated, etc.

Devices using electron plasma that is present in semiconductors have been intensively studied and developed in order to implement small, inexpensive terahertz wave radiating devices that need not to be cooled. A two-dimensional electron gas (2DEG) in field effect transistors (FETs) or high electron mobility transistors (HEMTs) is used as the electron plasma in the semiconductors. The 2DEG plasma waves as collective oscillations of electrons have a velocity on the order of $10^6$ m/s, which is at least one digit higher than the drift velocity of a single electron. Thus, operation in the terahertz frequency band, which is difficult to implement in common electronic devices using a single electron, can be implemented by using the plasma waves.

FIG. 8 shows a cross-sectional structure of a conventional terahertz wave radiating element (see, e.g., FIG. 1 of Physical Review Letters, Vol. 71, No. 15, pp. 2465-2468 (1993)). As shown in FIG. 8, the conventional terahertz wave radiating element is formed by a semiconductor layer 4, a gate insulating film 5, a two-dimensional electron gas (2DEG) region 6, a source electrode 1, a gate electrode 2, and a drain electrode 3. If a bias voltage is applied between the source electrode 1 and the drain electrode 3 in the terahertz wave radiating element having such a configuration, a 2DEG flow is produced in the 2DEG region 6. The 2DEG flow becomes an unstable state when it is reflected at the ends of the source and drain electrodes 1, 3 (plasma instability). In recent FET structures with reduced gate lengths, this plasma instability induces electron plasma oscillations in the terahertz frequency band, causing radiation of terahertz electromagnetic waves.

Recently, significant progress has been made in this technique, and it was verified in 2006 that terahertz electromagnetic waves are radiated at room temperature (see, e.g., Applied Physics Letters, 88, 141906 (2006)). According to this document, a terahertz electromagnetic wave output of about 0.1 µW is obtained from AlGaN/GaN HEMTs.

Terahertz wave radiating elements having a gate electrode formed in a grid pattern on a semiconductor heterostructure have also been proposed (see, e.g., Applied Physics Letters, 89, 263502 (2006), International Publication No. WO 2006/030608, and Japanese Patent Publication No. 2009-224467).

However, such semiconductor devices capable of radiating terahertz waves at room temperature by using electron plasma also have the following problems. The intensity of terahertz electromagnetic waves that can be radiated by such semiconductor devices is as low as 1 µW or less, and thus the output is not high enough for various applications such as security, inspection, etc. At present, power conversion efficiency is $1 \times 10^{-7}$, which is extremely low, and input power as high as about 1 W is required to provide an output of 0.1 µW. In order to implement practical terahertz wave radiating semiconductor devices, it is essential to increase the output and the power conversion efficiency.

SUMMARY

In order to achieve the above object, example terahertz wave radiating elements of the present invention will be proposed below.

A terahertz wave radiating element according to one aspect of the present invention includes: a first nitride semiconductor layer formed on a substrate; a second nitride semiconductor layer formed over the first nitride semiconductor layer, and having a wider bandgap than the first nitride semiconductor layer; and a gate electrode formed on the second nitride semiconductor layer, and source and drain electrodes formed on the second nitride semiconductor layer so as to face each other with the gate electrode interposed therebetween. Each of the source and drain electrodes is formed by a plurality of ohmic fingers that are arranged periodically.

With the above configuration, openings exposing the second nitride semiconductor are periodically located between the plurality of ohmic fingers. This reduces attenuation of a generated terahertz wave by the electrodes, whereby a high output terahertz wave radiating element can be implemented.

In the terahertz wave radiating element of the one aspect of the present invention, a plasma wave of a two-dimensional electron gas that is generated at a heterojunction with the second nitride semiconductor layer in the first nitride semiconductor layer is converted to a radiation field.

That is, when a direct current (DC) voltage is applied between two ohmic electrodes, a plasma oscillation in a terahertz band is induced in the two-dimensional electron gas. Typically, the plasma wave is a longitudinal wave propagating through a semiconductor layer, and is not radiated to the outside. However, in the terahertz wave radiating element of the one aspect of the present invention, the plasma wave can be converted to a radiation field by the periodic structure of the ohmic fingers. As a result, the generated plasma wave can be radiated to the outside as an electromagnetic wave in the terahertz band.

In the terahertz wave radiating element of the one aspect of the present invention, it is preferable that a period "Λ" with which the plurality of ohmic fingers are periodically arranged satisfy a relation of "Λ=ms/f," where "s" represents a velocity of the plasma wave, "f" represents a frequency of the radiation field, and "m" is a natural number.

With this design, the electromagnetic wave can be radiated at the desired frequency "f".

In the terahertz wave radiating element of the one aspect of the present invention, it is preferable that the period "Λ" be 1 µm or less.

In this case, "f" is equal to or higher than 1 THz (f≧1 THz) when the velocity of the plasma wave is approximately 1×10$^6$ m/s, and "m=1" for coupling in a fundamental mode. Thus, a terahertz electromagnetic wave having the frequency "f" of 1 THz or more can be emitted. Note that if coupling in a higher mode is used with "m=2 or 3," the period "Λ" can be increased to 2 μm or 3 μm, and tolerance of device design can be increased. However, since coupling efficiency in the higher mode is lower than that in the fundamental mode, radiation efficiency is reduced in the higher mode. Thus, in order to efficiently emit the terahertz electromagnetic wave of 1 THz or more, it is preferable that the period "Λ" be 1 μm or less so that the fundamental mode can be used.

In the terahertz wave radiating element of the one aspect of the present invention, it is preferable that a gate length "Lg" of the gate electrode satisfy a relation of "Lg=(2n−1)s/4f," where "s" represents a velocity of the plasma wave, "f" represents a frequency of the radiation field, and "n" is a natural number.

The plasma wave is reflected at both ends of a Schottky electrode. However, by designing the gate length "Lg" of the gate electrode in the manner described above, resonance of the plasma wave (plasma resonance) occurs at the frequency "f," and the plasma oscillation is efficiently induced. In particular, by using the above conditions to determine the finger period "Λ" for the frequency "f" that causes the plasma oscillation, the generated plasma oscillation can be emitted with high efficiency. That is, a high efficiency, high output terahertz wave radiating element can be implemented by appropriately designing the gate length "Lg" of the gate electrode and the period "Λ" of the ohmic fingers for the desired frequency "f".

In the terahertz wave radiating element of the one aspect of the present invention, it is preferable that the gate length "Lg" be 0.25 μm or less.

In this case, "f" is equal to or higher than 1 THz (f≧1 THz) when the velocity of the plasma wave is approximately 1×10$^6$ m/s, and "n=1" for resonance in the fundamental mode. Thus, the plasma resonance can be caused at 1 THz or more.

In the terahertz wave radiating element of the one aspect of the present invention, a finger length of the plurality of ohmic fingers may be equal to a gate length of the gate electrode.

As the finger length of the plurality of ohmic fingers is substantially the same as the gate length of the gate electrode, the gate electrode and the ohmic fingers form a periodic structure as a whole. Thus, the generated terahertz electromagnetic wave can be efficiently emitted.

In the terahertz wave radiating element of the one aspect of the present invention, a finger length of the plurality of ohmic fingers may be equal to a gate length of the gate electrode, and a distance between the gate electrode and one of those two of the plurality of ohmic fingers which are located close to both sides of the gate electrode may be equal to a distance between the gate electrode and the other ohmic finger.

In the terahertz wave radiating element of the one aspect of the present invention, a finger length of the plurality of ohmic fingers may be equal to a gate length of the gate electrode, and a distance between adjoining ones of the plurality of ohmic fingers may be equal to a distance between the gate electrode and each of those two of the plurality of ohmic fingers which are located close to both sides of the gate electrode.

In the terahertz wave radiating element of the one aspect of the present invention, a plurality of metal fingers, which are not electrically connected together, may be periodically arranged between the gate electrode and one of the source and drain electrodes.

By arranging the plurality of metal fingers that are not electrically connected together (i.e., that are not electrodes), the distance between the gate electrode and the source and drain electrodes can be arbitrarily designed while maintaining periodicity. Increasing the distance between the gate electrode and the source and drain electrodes can increase a voltage to be applied between the source and drain electrodes. This increases the intensity of the plasma oscillation that is induced in the two-dimensional electro gas, whereby a higher output element can be implemented.

In the terahertz wave radiating element of the one aspect of the present invention, multiple ones of the terahertz wave radiating element may be placed, and the gate electrode and the source and drain electrodes of each of the terahertz wave radiating elements may be connected to the gate electrode and the source and drain electrodes of the remainder of the terahertz wave radiating elements via an interconnect electrode.

This can increase the output by an amount corresponding to the number of elements placed.

In the terahertz wave radiating element of the one aspect of the present invention, the gate electrode may be formed by a plurality of gate fingers that are arranged periodically, and the gate fingers and the ohmic fingers may be arranged alternately.

As the multiple ones of the terahertz wave radiating element are provided, and the fingers form a periodic structure as a whole for radiation coupling, a high output, high efficiency terahertz wave radiating element is implemented.

The terahertz wave radiating element of the one aspect of the present invention may further include a plurality of interconnect electrodes formed in a longitudinal direction of the plurality of ohmic fingers so as to contact the plurality of ohmic fingers.

In this case, a current can be distributed and injected to the interconnect electrodes. This reduces the possibility of current concentration at the ends of the source and drain electrodes, whereby a large amount of current can be applied to the element. As the drive current can be increased, the intensity of the plasma oscillation that is induced in the two-dimensional electron gas is increased, whereby a higher output element can be implemented.

As described above, a high output, high efficiency terahertz wave radiating element can be obtained according to the terahertz wave radiating element of the one aspect of the present invention. Moreover, the terahertz wave radiating element of the one aspect of the present invention is small and inexpensive, and need not be cooled. Namely, the terahertz wave radiating element of the one aspect of the present invention has features that are difficult to obtain in conventional terahertz wave radiating elements. Thus, the terahertz wave radiating element of the one aspect of the present invention can be expected to greatly contribute to progress in the fields of applications using terahertz electromagnetic waves, such as security, biology, environment, and communication. Moreover, the terahertz wave radiating element of the one aspect of the present invention can be fabricated inexpensively by using the existing semiconductor processes, and thus can greatly facilitate widespread use of application systems or apparatuses.

DETAILED DESCRIPTION

Example embodiments of the present invention will be described below with reference to the accompanying drawings. Note that the technical idea of the present invention will be clearly explained below based on the accompanying drawings and detailed description of the invention. It will be apparent to those skilled in the art that various modifications and additions can be made to preferred embodiments of the present invention by using the technique disclosed in the present invention, without departing from the technical idea and scope of the present invention.

(First Embodiment)

Figure 1:
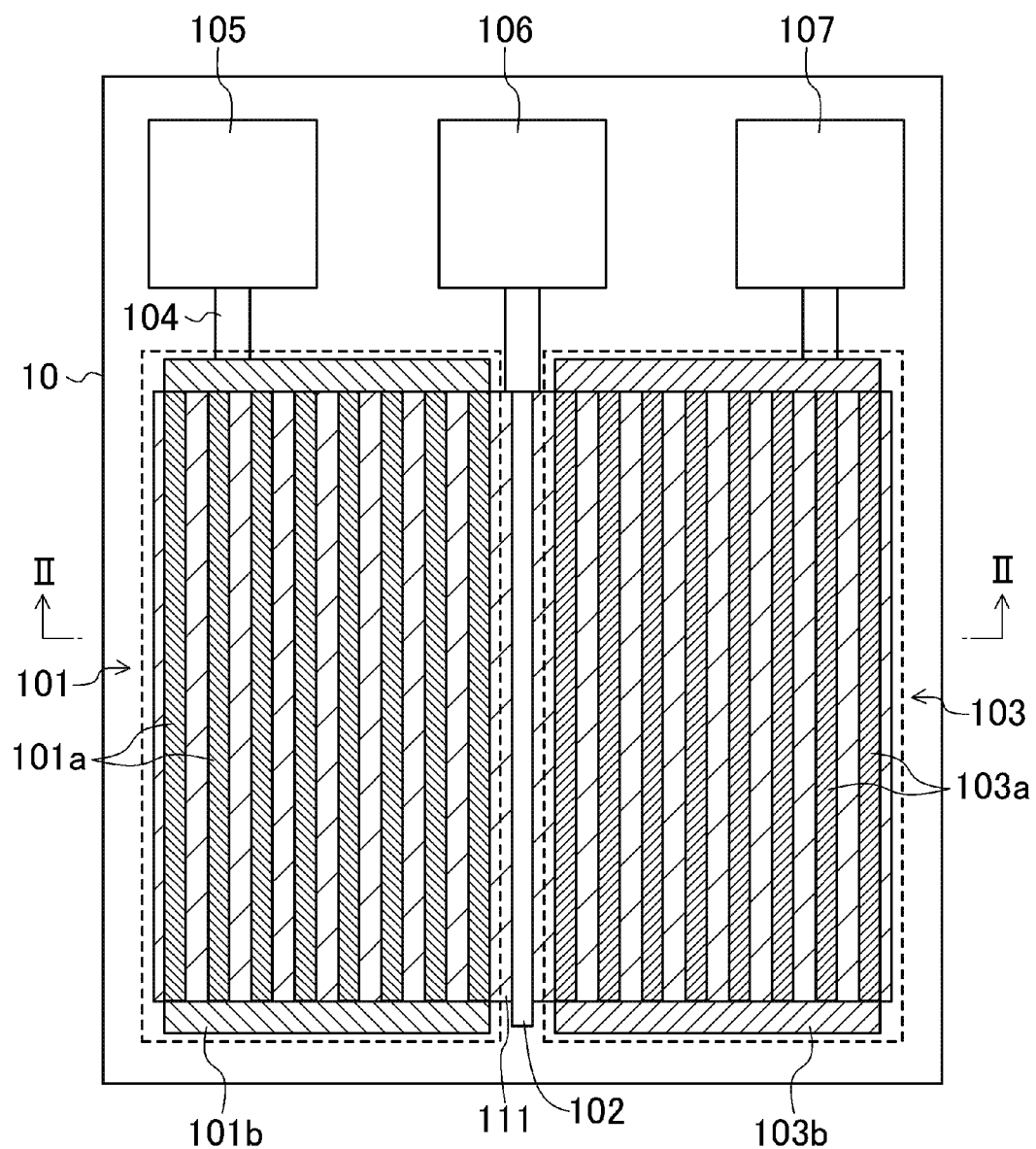
FIG. 1 is a plan view showing the structure of a terahertz wave radiating element according to a first embodiment of the present invention.

FIG. 1 shows a planar structure of a terahertz wave radiating element 10 according to a first embodiment of the present invention.

As shown in FIG. 1, a source electrode 101 and a drain electrode 103 are formed over a two-dimensional electron gas (2DEG) region 111 so as to face each other with a finger-shaped gate electrode 102 interposed therebetween. The source electrode 101 is formed by a plurality of source electrode fingers (ohmic fingers) 101a that are arranged periodically, and the drain electrode 103 is formed by a plurality of drain electrode fingers (ohmic fingers) 103a that are arranged periodically. Both the source electrode 101 and the drain electrode 103 are made of titanium (Ti) and aluminum (Al), and serve as ohmic electrodes for N-type GaN. The gate electrode 102 is made of nickel (Ni), platinum (Pt), or gold (Au), and serves as a Schottky electrode for N-type GaN.

The plurality of source electrode fingers 101a are electrically connected to a source interconnect electrode 101b, and the source interconnect electrode 101b is electrically connected to a source pad 105 via an interconnect electrode 104. The gate electrode 102 is electrically connected to a gate pad 106 via an interconnect electrode 104. The plurality of drain electrode fingers 103a are electrically connected to a drain interconnect electrode 103b, and the drain interconnect electrode 103b is electrically connected to a drain pad 107 via an interconnect electrode 104. Note that the source pad 105, the gate pad 106, and the drain pad 107 are electrically connected to an external drive circuit by a method such as Au wire bonding.

Figure 2:
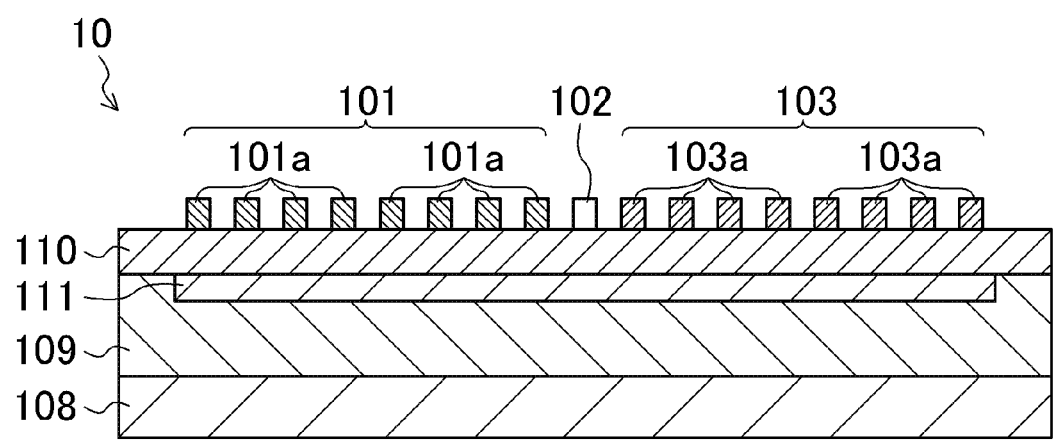
FIG. 2 is a cross-sectional view showing the structure of the terahertz wave radiating element according to the first embodiment of the present invention, taken along line II-II in FIG. 1.

FIG. 2 shows a cross-sectional structure of the terahertz wave radiating element 10 of the first embodiment of the present invention, taken along line II-II in FIG. 1.

As shown in FIG. 2, a nitride semiconductor layer 109 is formed on a substrate 108, and a nitride semiconductor layer 110 is formed over the nitride semiconductor layer 109. The nitride semiconductor layer 109 is made of, e.g., GaN, and the nitride semiconductor layer 110 is made of, e.g., $Al_xGa_{1-x}N$, and has a wider bandgap than the nitride semiconductor layer 109. A high density two-dimensional electron gas (2DEG) is generated at the interface between the nitride semiconductor layers 109, 110 due to spontaneous polarization or piezoelectric polarization. A 2DEG region 111 as shown in FIG. 1 is formed by increasing the resistance in a peripheral portion of the 2DEG by a method such as ion implantation.

As described above, the source electrode 101 formed by the plurality of source electrode fingers 101a, and the drain electrode 103 formed by the plurality of drain electrode fingers 103a are formed on the nitride semiconductor layer 110, and specifically over the 2DEG region 111, so as to face each other with the finger-shaped gate electrode 102 interposed therebetween.

In a manufacturing method of the terahertz wave radiating element 10 having the above structure shown in FIGS. 1-2, the nitride semiconductor layer 109 made of GaN, and the nitride semiconductor layer 110 made of $Al_xGa_{1-x}N$ are sequentially stacked on the substrate 108 by epitaxial growth. Then, the resistance of a region other than the 2DEG region 111 is increased by a method such as ion implantation to define the 2DEG region 111. Then, metal materials deposited on the nitride semiconductor layer 110 are patterned to form the source electrode 101 formed by the plurality of source electrode fingers 101a, the drain electrode 103 formed by the plurality of drain electrode fingers 103a, and the finger-shaped gate electrode 102.

In the present embodiment, the gate electrode 102 has a gate length (a dimension in the lateral direction in the figure) of 250 nm, and a gate width (a dimension in the vertical direction in the figure) of 300 µm. Both the gate-source distance and the gate-drain distance are 750 nm. The plurality of source electrode fingers 101a of the source electrode 101 has a finger length (a dimension in the lateral direction in the figure) of 250 nm, and the plurality of drain electrode fingers 103a of the drain electrode 103 also have a finger length (a dimension in the lateral direction in the figure) of 250 nm. The finger distance between the plurality of source electrode fingers 101a is 750 nm, and the finger distance between the plurality of drain electrode fingers 103a is 750 nm. The plurality of source electrode fingers 101a have an electrode width (a dimension in the vertical direction in the figure) of 300 µm, and the plurality of drain electrode fingers 103a have an electrode width (a dimension in the vertical direction in the figure) of 300 µm.

As described above, in the terahertz wave radiating element of the present embodiment, the source electrode 101 and the drain electrode 103 are formed by the plurality of periodically arranged source electrode fingers 101a and the plurality of periodically arranged drain electrode fingers 103a. In other words, in the source electrode 101 and the drain electrode 103, openings exposing the nitride semiconductor layer 110 are periodically formed between the plurality of source electrode fingers 101a and between the plurality of drain electrode fingers 103a so that the plurality of source electrode fingers 101a and the plurality of drain electrode fingers 103a are periodically arranged. The terahertz wave radiating element of the present embodiment has such periodic openings, and is different in this respect from the structures of conventional common FETs or HEMTs having no such openings. In the structures of the conventional common FETs or HEMTs, even if terahertz waves are generated in a semiconductor layer, such terahertz waves are significantly attenuated by an electrode metal. Thus, the terahertz waves cannot be efficiently output to the outside, making it difficult to provide a high output. However, according to the present embodiment, the openings are periodically formed between the electrodes (the plurality of source electrode fingers 101a, the gate electrode 102, and the plurality of drain electrode fingers 103a) formed on the nitride semiconductor layer 110. This can reduce attenuation of the terahertz waves caused by the metals of the electrodes upon emission of the terahertz waves, whereby the terahertz waves can be efficiently radiated. Thus, a high output terahertz wave radiating element can be implemented.

Operating principles of the terahertz wave radiating element 10 of the present embodiment will be described below.

When a voltage is applied between the source electrode 101 and the drain electrode 103, a current flows with the 2DEG as a carrier. Plasma wave oscillations in the terahertz band are induced in the 2DEG flow due to plasma instability that is caused by reflection at both ends of the gate electrode 102. Typically, such plasma waves are longitudinal waves propagating through a semiconductor layer, and are a non-radiation field that cannot be radiated to the outside.

However, unlike the structures of the conventional FETs or HEMTs, in the terahertz wave radiating element 10 of the present embodiment, both the source electrode 101 and the drain electrode 103 have a periodic structure formed by the plurality of source electrode fingers 101a and the plurality of drain electrode fingers 103a, as described above. Since this periodic structure satisfies the relation of conservation of wavenumber, the plasma waves, which are typically the non-radiation field, can be converted to a radiation field capable of propagating through a free space in the present embodiment.

Specifically, the source electrode fingers 101a and the drain electrode fingers 103a have a period "Λ" of 1 μm in the present embodiment. Thus, if the velocity "s" of the plasma waves is $1 \times 10^6$ m/s, and a natural number "m" is 1, the frequency "f" is 1 THz based on the relation of the conservation of wavenumber, "Λ=ms/f". That is, in the present embodiment, radiation field coupling in a fundamental mode occurs at 1 THz, and electromagnetic waves can be efficiently radiated. Note that radiation field coupling can be caused even at 2 THz and 3 THz as higher modes, but coupling efficiency of the higher modes is lower than that of the fundamental mode.

Thus, when a voltage is applied between the source electrode 101 and the drain electrode 103 in the terahertz wave radiating element of the present embodiment, plasma wave oscillations in the terahertz band are induced in the semiconductor layer, and the plasma waves are converted to the radiation field by the periodic structure of the ohmic electrodes, whereby terahertz electromagnetic waves are radiated to the outside.

In particular, the gate electrode 102 has a gate length "Lg" of 250 nm in the present embodiment. Thus, if the velocity "s" of the plasma waves is $1 \times 10^6$ m/s, and a natural number "n" is 1, the frequency "f" is 1 THz based on the relation of plasma resonance, "Lg=(2n−1)s/4f". That is, since 1st-order plasma resonance occurs at 1 THz, the plasma waves can be efficiently induced. The generated plasma waves are converted to the radiation field by fundamental mode coupling of the periodic structure, whereby terahertz electromagnetic waves of 1 THz are emitted.

Note that in the present embodiment, the gate length is equal to the finger length of the ohmic electrodes, and the gate-source distance, the gate-drain distance, and the distance between adjoining fingers are the same. That is, the gate length of the gate electrode 102, the finger length of the source electrode fingers 101a of the source electrode 101, and the finger length of the drain electrode fingers 103a of the drain electrode 103 are 250 nm, and the distance between the gate electrode 102 and the source electrode 101, the distance between the gate electrode 102 and the drain electrode 103, the distance between the source electrode fingers 101a, and the distance between the drain electrode fingers 103a are 750 nm. Thus, as the finger-shaped electrode patterns (the gate electrode 102, the source electrode fingers 101a, and the drain electrode fingers 103a) are arranged so as to form a periodic structure having a period of 1 μm as a whole, generated terahertz electromagnetic waves can be efficiently emitted.

It should be noted that the gate length of the gate electrodes 102, the finger length of the source electrode fingers 101a, and the finger length of the drain electrode fingers 103a need not necessarily be exactly the same. Although errors may be caused even by lithography accuracy in the manufacturing process, etc., such errors are acceptable as long as the overall periodicity is maintained, and terahertz electromagnetic waves are efficiently emitted. Specifically, an acceptable error range of the gate length and the finger lengths is ±20% or less, preferably ±10% or less, and more preferably ±5% or less. Similarly, as for the distance between the gate electrode 102 and the source electrode 101, the distance between the gate electrode 102 and the drain electrode 103, the distance between the source electrode fingers 101a, and the distance between the drain electrode fingers 103a, namely as for the gate-source distance, the gate-drain distance, and the finger distance, errors are acceptable as long as terahertz electromagnetic waves are efficiently emitted. Specifically, an acceptable error range of these distances is ±20% or less, preferably ±10% or less, and more preferably ±5% or less.

Note that the above embodiment is described with respect to the case where the period "Λ" is 1 μm. However, the present invention is not limited to this, and the period "Λ" may be any value of 1 μm or less. In this case, if the velocity "s" of the plasma waves is $1 \times 10^6$ m/s, and the natural number "m" is 1, the frequency "f" is equal to or higher than 1 THz (f≧1 THz), and terahertz electromagnetic waves having the frequency "f" of 1 THz or more can be emitted by using fundamental mode coupling. Note that when "m" is 2 and a higher mode is used, radiation coupling can be caused at 2 THz with the period "Λ" of 1 μm. Even at the frequency "f" of 1 THz, the period "Λ" is 2 μm if "m" is 2. The period having a larger value means that tolerance of device design or process can be increased. However, it should be noted that as coupling efficiency of higher modes is lower than that of the fundamental mode, radiation efficiency of the higher modes is also lower than that of the fundamental mode.

The above embodiment is described with respect to the case where the length "Lg" of the Schottky electrode (the gate length of the gate electrode 102) is 0.25 μm. However, the present invention is not limited to this, and the gate length "Lg" may be any value of 0.25 μm or less. In this case, if the velocity "s" of the plasma waves is $1 \times 10^6$ m/s, and the natural number "n" is 1, the frequency "f" is equal to or higher than 1 THz (f≧1 THz), and plasma resonance can be caused at 1 THz or more. In this case as well, using higher modes can induce the plasma resonance at higher frequencies, but efficiency of plasma wave generation of the higher modes is lower than that of the fundamental mode.

For example, if the gate length of the gate electrode 102, the finger length of the source electrode fingers 101a of the source electrode 101, and the finger length of the drain electrode fingers 103a of the drain electrode 103 are 125 nm, and the distance between the gate electrode 102 and the source electrode 101, the distance between the gate electrode 102 and the drain electrode 103, the distance between the source electrode fingers 101a, and the distance between the drain electrode fingers 103a are 375 nm, 1st-order plasma resonance occurs at 2 THz, and generated plasma waves are converted to the radiation field in the fundamental mode by periodic metal patterns having a period of 500 nm. Thus, terahertz electromagnetic waves of 2 THz can be radiated.

Note that in order to efficiently generate terahertz electromagnetic waves, a FET of the terahertz wave radiating element 10 can be operated in its saturation region with the source and gate electrodes 101, 102 being short-circuited together.

Since the velocity of the plasma waves can be controlled by changing the density of the two-dimensional electron gas by the voltage of the gate electrode 102, the frequency of terahertz electromagnetic waves can also be controlled by the gate voltage.

The substrate 108 is preferably made of a material having a low absorption coefficient in the terahertz band. For example, a high resistance silicon substrate can be used as the substrate having a low absorption coefficient. In this case, generated terahertz waves can be emitted from the device without being attenuated. By using the substrate having a low absorption coefficient, the terahertz electromagnetic waves can also be emitted from the substrate side.

(Second Embodiment)

Figure 3:
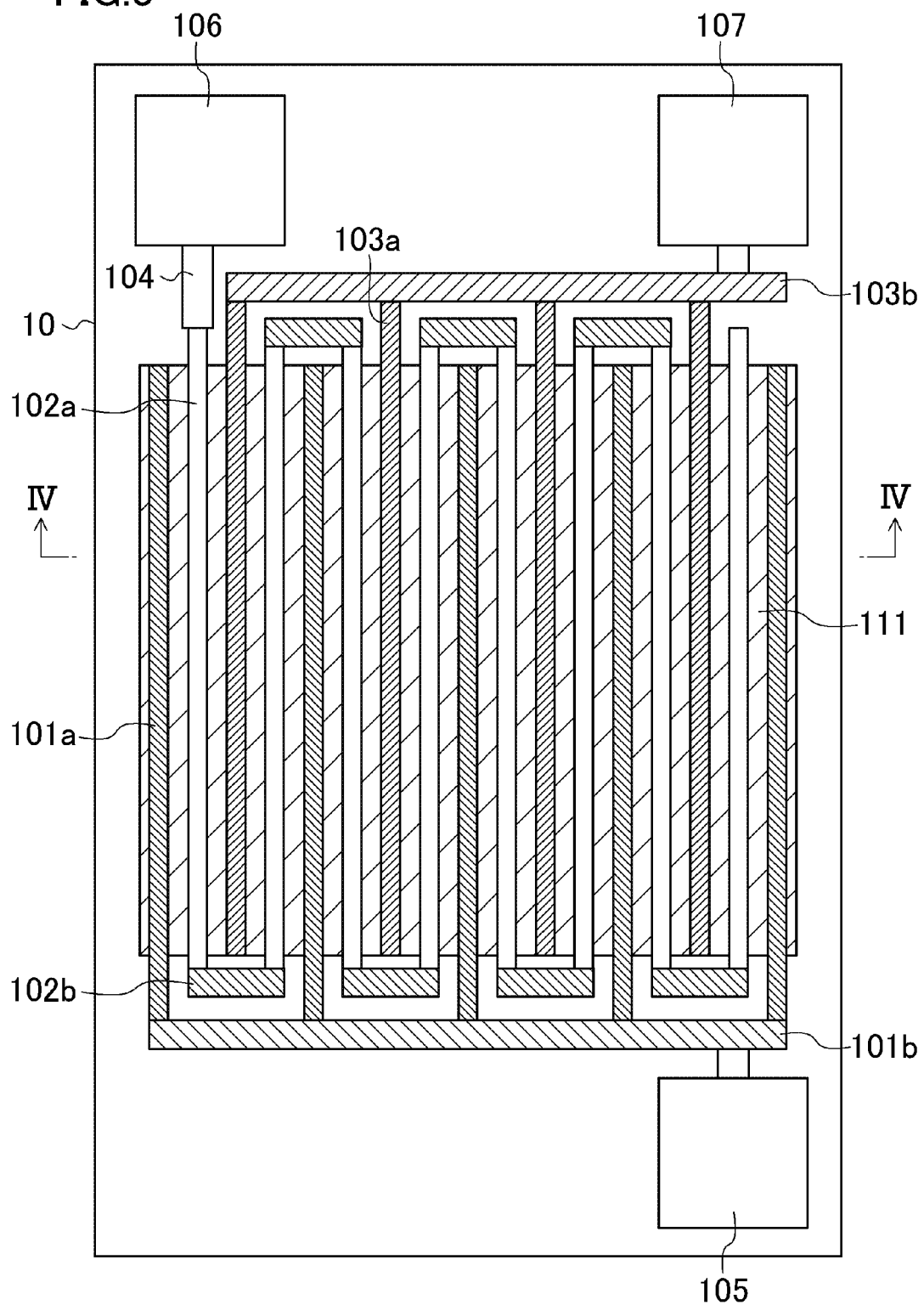
FIG. 3 is a plan view showing the structure of a terahertz wave radiating element according to a second embodiment of the present invention.

FIG. 3 shows a planar structure of a terahertz wave radiating element 10 according to a second embodiment of the present invention.

As shown in FIG. 3, a source electrode 101, a gate electrode 102, and a drain electrode 103 are formed over a 2DEG region 111. The source electrode 101 is formed by a plurality of source electrode fingers (ohmic fingers) 101a that are arranged periodically, the gate electrode 102 is formed by a plurality of gate electrode fingers (Schottky fingers) 102a that are arranged periodically, and the drain electrode 103 is formed by a plurality of drain electrode fingers (ohmic fingers) 103a that are arranged periodically. Specifically, the source electrode finger 101a, the gate electrode finger 102a, the drain electrode finger 103a, the gate electrode finger 102a, and the source electrode finger 101a are repeatedly formed so that the source electrode finger 101a faces the drain electrode finger 103a with the gate electrode finger 102a interposed therebetween. Both the source electrode 101 and the drain electrode 103 are made of Ti and Al, and serve as ohmic electrodes for N-type GaN. The gate electrode 102 is made of Ni, Pt, or Au, and serves as a Schottky electrode for N-type GaN.

The plurality of source electrode fingers 101a are electrically connected to a source interconnect electrode 101b, and the source interconnect electrode 101b is electrically connected to a source pad 105. The plurality of gate electrode fingers 102a are electrically connected to a gate interconnect electrode 102b, and the gate interconnect electrode 102b is electrically connected to a gate pad 106. The plurality of drain electrode fingers 103a are electrically connected to a drain interconnect electrode 103b, and the drain interconnect electrode 103b is electrically connected to a drain pad 107. Note that the source pad 105, the gate pad 106, and the drain pad 107 are electrically connected to an external drive circuit by a method such as Au wire bonding.

Figure 4:
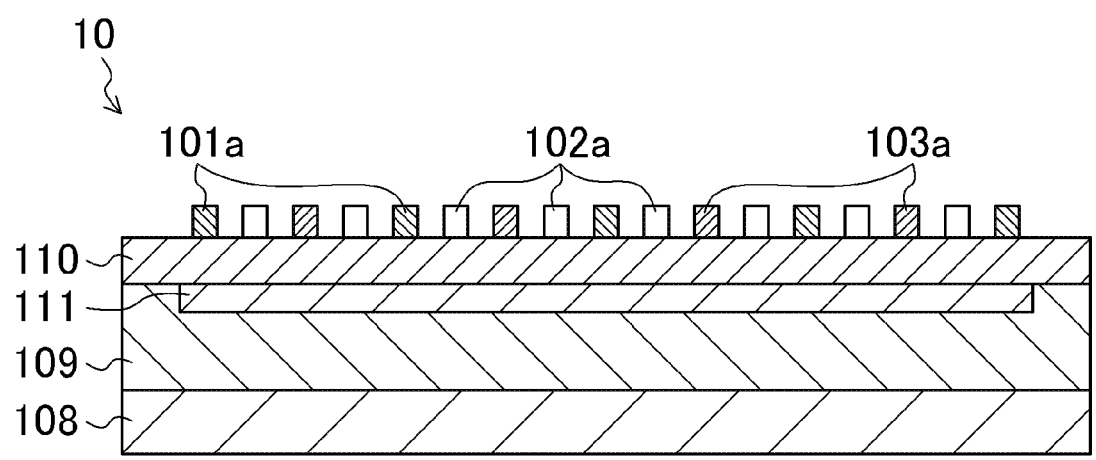
FIG. 4 is a cross-sectional view showing the structure of the terahertz wave radiating element according to the second embodiment of the present invention, taken along line IV-IV in FIG. 3.

FIG. 4 shows a cross-sectional structure of the terahertz wave radiating element 10 of the second embodiment of the present invention, taken along line IV-IV in FIG. 3.

As shown in FIG. 4, a nitride semiconductor layer 109, which is made of, e.g., GaN, is formed on a substrate 108, and a nitride semiconductor layer 110, which is made of, e.g., $Al_xGa_{1-x}N$, is formed over the nitride semiconductor layer 109. A high density 2DEG is generated at the interface between the nitride semiconductor layers 109, 110 due to spontaneous polarization or piezoelectric polarization. A 2DEG region 111 is defined by increasing the resistance in a peripheral portion of the 2DEG by a method such as ion implantation.

As described above, the source electrode 101 formed by the plurality of source electrode fingers 101a, the gate electrode 102 formed by the plurality of gate electrode fingers 102a, and the drain electrode 103 formed by the plurality of drain electrode fingers 103a are formed on the nitride semiconductor layer 110, and specifically over the 2DEG region 111, so that the source electrode finger 101a faces the drain electrode finger 103a with the gate electrode finger 102a interposed therebetween.

As described above, in the terahertz wave radiating element 10 of the present embodiment, as shown in FIGS. 3-4, the source electrode finger 101a and the drain electrode finger 103a are positioned on both sides of the gate electrode finger 102a, forming a single FET. That is, eight FETs are positioned in a single chip, and adjoining ones of the FETs share the source electrode 101 or the drain electrode 103.

In the present embodiment, the gate electrode 102 has a gate length (a dimension in the lateral direction in the figure) of 250 nm, and a gate width (a dimension in the vertical direction in the figure) of 300 μm. Note that as used herein, the "gate width" is a value defined by the 2DEG region 111, and an actual gate electrode is formed to have a gate width greater than the above value by about 5 to 10 μm so as to contact the gate interconnect electrode. Both the gate-source distance and the gate-drain distance are 750 nm. The plurality of source electrode fingers 101a of the source electrode 101, the plurality of gate electrode fingers 102a of the gate electrode 102, and the plurality of drain electrode fingers 103a of the drain electrode 103 have a finger length (a dimension in the lateral direction in the figure) of 250 nm. The distance between adjoining ones of the source electrode fingers 101a, the distance between adjoining ones of the gate electrode fingers 102a, and the distance between adjoining ones of the drain electrode fingers 103a are 750 nm. Thus, in the terahertz wave radiating element 10 of the present embodiment, the source electrode fingers 101a, the gate electrode fingers 102a, and the drain electrode fingers 103a are regularly arranged so as to form a periodic structure having a period of 1 μm as a whole. Note that it is preferable that the electrode width of the plurality of source electrode fingers 101a be equal to an integral multiple of the wavelength of terahertz waves to be radiated. If "λ" represents the wavelength in vacuum of the terahertz waves to be radiated, and "n" represents the refractive index of a surface material of the terahertz wave radiating element, the wavelength of the terahertz waves in the surface material is represented by "λ/n." For example, if the frequency of the terahertz waves to be radiated is 1 THz (λ≈300 μm), the wavelength of the terahertz waves in the surface material is about 150 μm. It is assumed in this example that the surface of the terahertz wave radiating element is coated with a protective film (not shown), and that the protective film has a refractive index "n" of 2. That is, if the electrode width (a dimension in the vertical direction in the figure) of the plurality of source electrode fingers 101a is, e.g., four times the wavelength, this electrode width is 600 μm. The same applies to the electrode width of the plurality of gate electrode fingers 102a and the electrode width of the plurality of drain electrode fingers 103a. Note that the electrode width is not limited to four times the wavelength, and may be one, two, or three times the wavelength. The electrode width can be an integral multiple of a quarter wavelength in order to make the electrode width smaller than the wavelength. For example, the electrode width is 37.5 μm when it is ¼ times the wavelength, and is 75 μm when it is ¾ times the wavelength.

As described above, the terahertz wave radiating element 10 of the present embodiment is structured so that the source electrode fingers 101a, the gate electrode fingers 102a, and the drain electrode fingers 103 are periodically arranged. In other words, openings exposing the nitride semiconductor layer 110 are periodically formed between adjoining ones of the fingers so that the source electrode fingers 101a, the gate electrode fingers 102a, and the drain electrode fingers 103a are periodically arranged. As the terahertz wave radiating element of the present embodiment has such periodic openings, this terahertz wave radiating element can reduce attenuation of the terahertz waves caused by the metals of the fingers upon emission of the terahertz waves. Thus, the terahertz waves can be efficiently radiated, whereby a high output terahertz wave radiating element can be implemented.

Moreover, since the present embodiment is structured so that the eight FETs are connected to the source pad 105, the gate pad 106, and the drain pad 107, these FETs can be driven simultaneously. That is, if a DC voltage is applied between the source electrode 101 and the drain electrode 103 to drive the element, plasma waves are generated in each of the eight FETs, and the plasma waves are converted to the radiation field of terahertz electromagnetic waves by the overall periodic structure of the element including the fingers of the other FETs. Thus, as the number of plasma wave sources is equal to the number of FETs placed in the element, the terahertz wave output can be increased to eight times that of an element having only one FET with the same gate width. Thus, the terahertz waves can be more efficiently radiated, whereby a higher output terahertz wave radiating element can be implemented.

Note that since a manufacturing method of the terahertz wave radiating element 10 having the structure of FIGS. 3-4 is similar to the method described in the first embodiment, description thereof will be omitted.

Note that the present embodiment is described with respect to the case where the source electrode fingers 101a, the gate electrode fingers 102a, and the drain electrode fingers 103a have the same finger length. However, the finger lengths of the source electrode fingers 101a, the gate electrode fingers 102a, and the drain electrode fingers 103a need not necessarily be exactly the same. As in the first embodiment, errors in the finger lengths are acceptable as long as the overall periodicity is maintained, and terahertz electromagnetic waves are efficiently emitted. Specifically, an acceptable error range of the finger lengths is ±20% or less, preferably ±10% or less, and more preferably ±5% or less. Similarly, as for the distances between the fingers, errors are acceptable as long as terahertz electromagnetic waves are efficiently emitted. Specifically, an acceptable error range of the distances between the fingers is ±20% or less, preferably ±10% or less, and more preferably ±5% or less.

The present embodiment is described with respect to the case where the period "Λ" is 1 μm. However, the present invention is not limited to this, and the period "Λ" may be any value of 1 μm or less, as described in the first embodiment.

The present embodiment is described with respect to the case where the length (the finger length) of the gate electrode fingers 102a of the gate electrode 102 is 0.25 μm. However, the present invention is not limited to this, and the finger length may be any value of 0.25 μm or less, as described in the first embodiment.

Note that in order to efficiently generate the terahertz electromagnetic waves, the FETs of the terahertz wave radiating element 10 can be operated in their saturation region with the source and gate electrodes 101, 102 being short-circuited together.

Since the velocity of the plasma waves can be controlled by changing the density of the 2DEG by the voltage of the gate electrode 102 formed by the plurality of gate electrode fingers 102a, the frequency of the terahertz electromagnetic waves can also be controlled by the gate voltage.

The substrate 108 is preferably made of a material having a low absorption coefficient in the terahertz band. For example, a high resistance silicon substrate can be used as the substrate having a low absorption coefficient. In this case, generated terahertz waves can be emitted from the device without being attenuated. By using the substrate having a low absorption coefficient, the terahertz electromagnetic waves can also be emitted from the substrate side.

(Third Embodiment)

Figure 5:
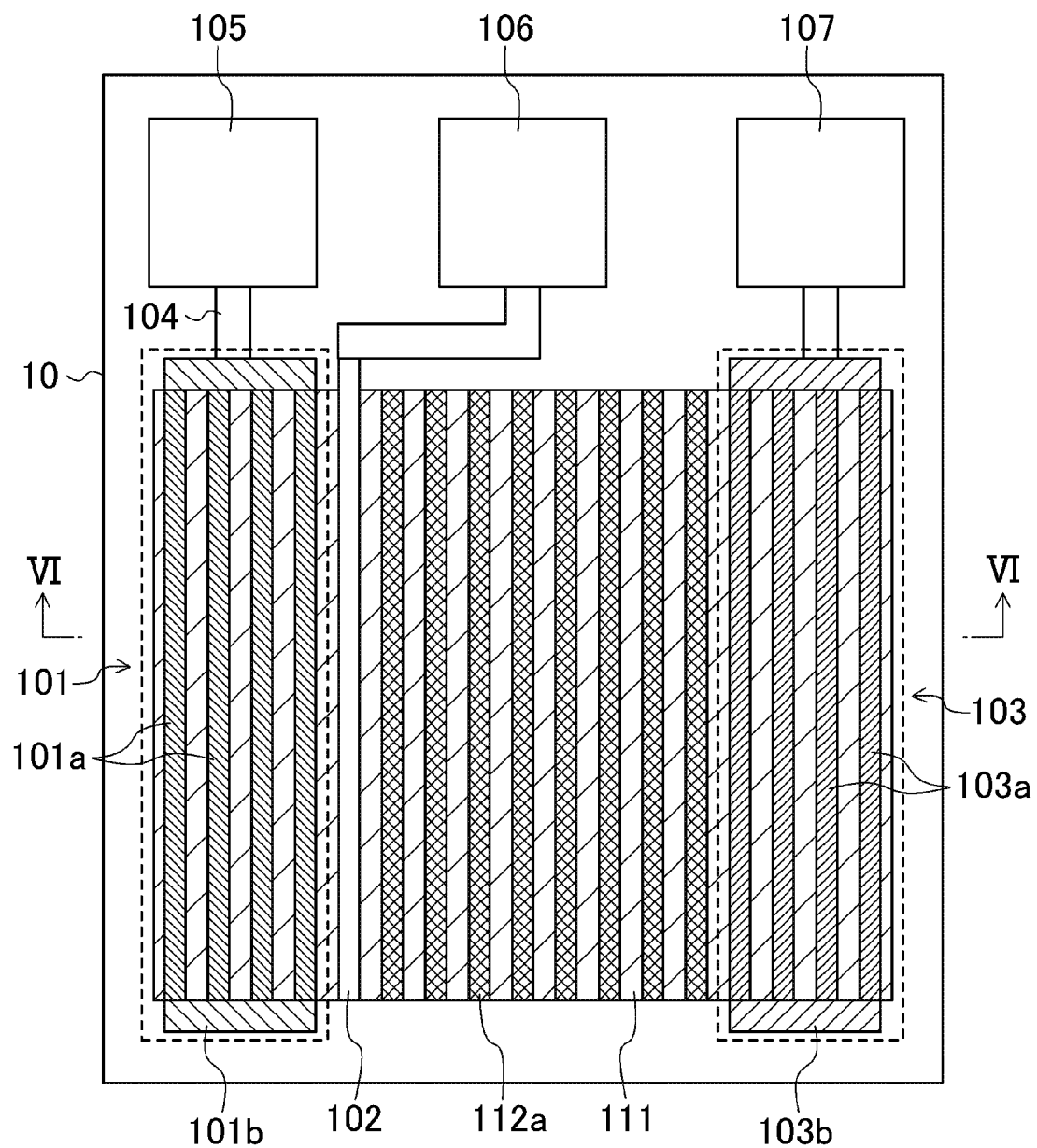
FIG. 5 is a plan view showing the structure of a terahertz wave radiating element according to a third embodiment of the present invention.

FIG. 5 shows a planar structure of a terahertz wave radiating element 10 according to a third embodiment of the present invention.

As shown in FIG. 5, a source electrode 101 and a drain electrode 103 are formed over a 2DEG region 111 so as to face each other with a finger-shaped gate electrode 102 interposed therebetween. The source electrode 101 is formed by a plurality of source electrode fingers (ohmic fingers) 101a that are arranged periodically, and the drain electrode 103 is formed by a plurality of drain electrode fingers (ohmic fingers) 103a that are arranged periodically. Note that specific structures of the source electrode 101, the gate electrode 102, and the drain electrode 103 are as described in the first embodiment, and description thereof will be omitted.

In the present embodiment, a plurality of metal fingers 112a, which are not electrically connected together, are periodically arranged between the gate electrode 102 and the drain electrode 103. The metal fingers 112a are made of Ti and Al, and have a finger length (a dimension in the lateral direction in the figure) of 250 nm, and the distance between adjoining ones of the metal fingers 112a is 750 nm. The metal fingers 112a have an electrode width (a dimension in the vertical direction in the figure) of 300 μm.

Figure 6:
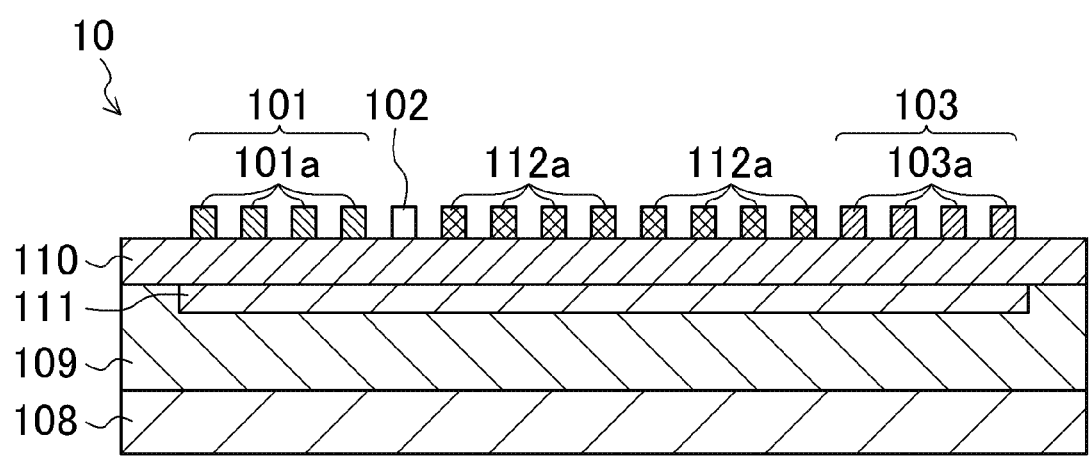
FIG. 6 is a cross-sectional view showing the structure of the terahertz wave radiating element according to the third embodiment of the present invention, taken along line VI-VI in FIG. 5.

FIG. 6 shows a cross-sectional structure of the terahertz wave radiating element 10 according to the third embodiment of the present invention, taken along line VI-VI in FIG. 5.

The cross-sectional structure of the terahertz wave radiating element 10 of FIG. 6 is different from that of the terahertz wave radiating element 10 of FIG. 2 in that the plurality of metal fingers 112a are formed between the gate electrode 102 and the drain electrode 103 on the nitride semiconductor layer 110, and specifically over the 2DEG region 111. Since the structure of the terahertz wave radiating element 10 of FIG. 6 is otherwise similar to that of the terahertz wave radiating element 10 of FIG. 2, repetitive description thereof will be omitted.

Thus, according to the present embodiment, the source electrode fingers 101a, the gate electrode 102, the metal fingers 112a, and the drain electrode fingers 103 are regularly arranged to form a periodic structure having a period of 1 μm as a whole. With this structure, as in the first embodiment, plasma wave oscillations in the terahertz band are induced in the semiconductor layer, and the plasma waves are converted to the radiation field by the periodic structure of the ohmic electrodes, whereby the terahertz electromagnetic waves are radiated to the outside. This structure can also reduce attenuation of the terahertz waves caused by the metals of the electrodes upon emission of the terahertz waves, whereby the terahertz waves can be efficiently radiated. Thus, a high output terahertz wave radiating element can be implemented.

Moreover, in the present embodiment, the plurality of metal fingers 112a are formed between the gate electrode 102 and the drain electrode 103, and the distance between the gate electrode 102 and the drain electrode 103 is 8.75 μm. This distance is sufficiently longer than 0.75 μm, which is the distance between the gate electrode 102 and the drain electrode 103 in the first embodiment. Thus, the voltage to be applied between the source electrode 101 and the drain electrode 103 can be increased. This increases the intensity of the plasma wave oscillations that are induced in the 2DEG, whereby a higher output terahertz wave radiating element can be implemented.

Note that the present embodiment is described with respect to the case where eight metal fingers 112 are provided. However, the present invention is not limited to this, and any number of metal fingers 112 may be provided in the element.

Note that since a manufacturing method of the terahertz wave radiating element 10 having the structure of FIGS. 5-6 is similar to the method described in the first embodiment, description thereof will be omitted.

Note that the present embodiment is described with respect to the case where the finger length of the source electrode fingers 101a, the gate length of the finger-shaped gate electrode 102, the finger length of the metal fingers 102a, and the finger length of the drain electrode fingers 103a are the same. However, the finger length of the source electrode fingers 101a, the gate length of the finger-shaped gate electrode 102, the finger length of the metal fingers 102a, and the finger length of the drain electrode fingers 103a need not necessarily be exactly the same. As in the first embodiment, errors in the finger lengths and the gate length are acceptable as long as the overall periodicity is maintained, and terahertz electromagnetic waves are efficiently emitted. Specifically, an acceptable error range of the finger lengths and the gate length is ±20% or less, preferably ±10% or less, and more preferably ±5% or less. Similarly, as for the distances between the fingers and the distances between the gate electrode and each finger adjoining the gate electrode, errors are acceptable as long as terahertz electromagnetic waves are efficiently emitted. Specifically, an acceptable error range is ±20% or less, preferably ±10% or less, and more preferably ±5% or less.

The present embodiment is described with respect to the case where the period "Λ" is 1 μm. However, the present invention is not limited to this, and the period "Λ" may be any value of 1 μm or less, as described in the first embodiment.

The present embodiment is described with respect to the case where the gate length of the gate electrode 102 is 0.25 μm. However, the present invention is not limited to this, and the gate length may be any value of 0.25 μm or less, as described in the first embodiment.

Note that in order to efficiently generate the terahertz electromagnetic waves, a FET of the terahertz wave radiating element 10 can be operated in its saturation region with the source and gate electrodes 101, 102 being short-circuited together.

Since the velocity of the plasma waves can be controlled by changing the density of the 2DEG by the voltage of the gate electrode 102, the frequency of the terahertz electromagnetic waves can also be controlled by the gate voltage.

The substrate 108 is preferably made of a material having a low absorption coefficient in the terahertz band. For example, a high resistance silicon substrate can be used as the substrate having a low absorption coefficient. In this case, generated terahertz waves can be emitted from the device without being attenuated. By using the substrate having a low absorption coefficient, the terahertz electromagnetic waves can also be emitted from the substrate side.

(Fourth Embodiment)

Figure 7:
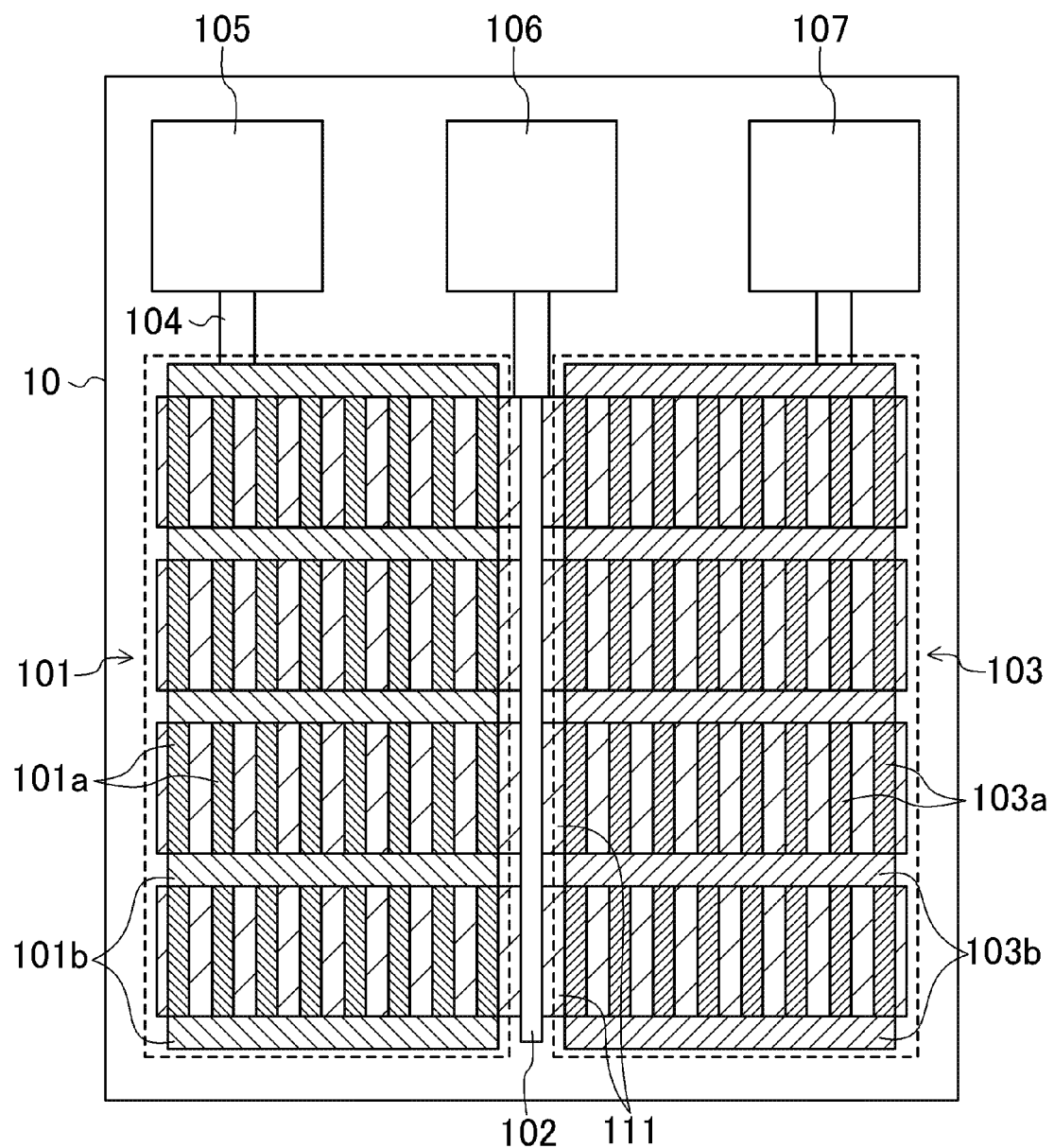
FIG. 7 is a plan view showing the structure of a terahertz wave radiating element according to a fourth embodiment of the present invention.
Figure 8:
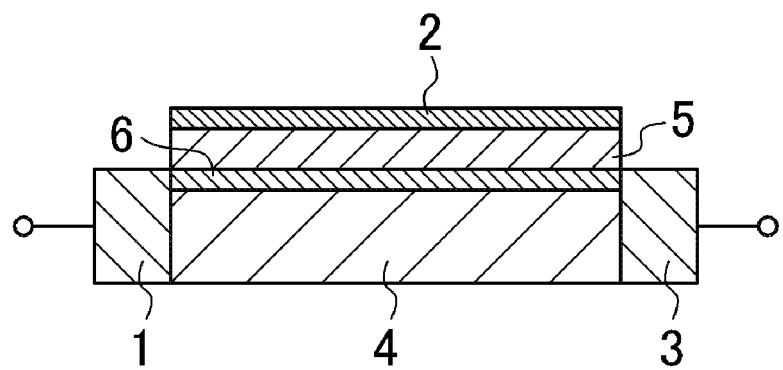
FIG. 8 is a cross-sectional view showing the structure of a conventional terahertz wave radiating element.

FIG. 7 shows a planar structure of a terahertz wave radiating element 10 according to a fourth embodiment of the present invention.

The terahertz wave radiating element 10 of the present embodiment shown in FIG. 7 is different from the terahertz wave radiating element 10 of the first embodiment shown in FIG. 1 in that each of a plurality of source electrode fingers (ohmic fingers) 101a of a source electrode 101, and each of a plurality of drain electrode fingers (ohmic fingers) 103a of a drain electrode 103 are separated into portions so as to contact a plurality of source interconnect electrodes 101b and a plurality of drain interconnect electrodes 103b. Since the structure of the terahertz wave radiating element 10 of the present embodiment is otherwise similar to that of the terahertz wave radiating element 10 of the first embodiment, repetitive description thereof will be omitted. Those portions of a semiconductor layer where the source interconnect electrodes 101b and the drain interconnect electrodes 103b are formed serve as high resistance regions by ion implantation. The source interconnect electrodes 101b and the drain interconnect electrodes 103b have a width (a dimension in the vertical direction in the figure) of 10 μm, and are arranged with a period of 75 μm.

Thus, according to the present embodiment, as in the first embodiment, plasma wave oscillations in the terahertz band are induced in the semiconductor layer, and the plasma waves are converted to the radiation field by the periodic structure of the ohmic electrodes, whereby the terahertz electromagnetic waves are radiated to the outside. The present embodiment can also reduce attenuation of the terahertz waves caused by the metals of the electrodes upon emission of the terahertz waves, whereby the terahertz waves can be efficiently radiated. Thus, a high output terahertz wave radiating element can be implemented.

Moreover, as the plurality of source interconnect electrodes 101b and the plurality of drain interconnect electrodes 103b are formed in the present embodiment, a current can be distributed and injected to the interconnect electrodes. This reduces the possibility of current concentration at the ends of the source and drain electrodes 101, 103, and thus reduces the current density, whereby a large amount of current can be injected to the element without breaking the source electrode 101 and the drain electrode 103. As the drive current is increased, the intensity of plasma oscillations that are induced in the 2DEG is increased, whereby a higher output element can be implemented.

Although the above embodiments use Schottky FETs whose gate electrodes are Schottky electrodes, the present invention is not limited to this, and metal insulator semiconductor field effect transistors (MISFETs) having a gate insulating film between a gate electrode and a semiconductor layer may be used.

Note that the present invention is useful for the structures of terahertz wave radiating elements, and is especially useful for imaging apparatuses, nondestructive inspection apparatuses, large capacity communication systems, etc.

What is claimed is:

1. A terahertz wave radiating element, comprising:
a first nitride semiconductor layer formed on a substrate;
a second nitride semiconductor layer formed over the first nitride semiconductor layer, and having a wider bandgap than the first nitride semiconductor layer; and
a gate electrode formed on the second nitride semiconductor layer, and source and drain electrodes formed on the second nitride semiconductor layer so as to face each other with the gate electrode interposed therebetween, wherein:
each of the source and drain electrodes is formed by a plurality of ohmic fingers that are arranged periodically,
a plasma wave of a two-dimensional electron gas that is generated at a heterojunction with the second nitride semiconductor layer in the first nitride semiconductor layer is converted to a radiation field, and
a period "Λ" with which the plurality of ohmic fingers are periodically arranged satisfies a relation of "Λ=ms/f," where "s" represents a velocity of the plasma wave, "f" represents a frequency of the radiation field, and "m" is a natural number.

2. The terahertz wave radiating element of claim 1, wherein the period "Λ" is 1 µm or less.

3. A terahertz wave radiating element, comprising:
a first nitride semiconductor layer formed on a substrate;
a second nitride semiconductor layer formed over the first nitride semiconductor layer, and having a wider bandgap than the first nitride semiconductor layer; and
a gate electrode formed on the second nitride semiconductor layer, and source and drain electrodes formed on the second nitride semiconductor layer so as to face each other with the gate electrode interposed therebetween, wherein:
each of the source and drain electrodes is formed by a plurality of ohmic fingers that are arranged periodically,
a plasma wave of a two-dimensional electron gas that is generated at a heterojunction with the second nitride semiconductor layer in the first nitride semiconductor layer is converted to a radiation field, and
a gate length "Lg" of the gate electrode satisfies a relation of "Lg=(2n−1)s/4f," where "s" represents a velocity of the plasma wave, "f" represents a frequency of the radiation field, and "n" is a natural number.

4. The terahertz wave radiating element of claim 3, wherein the gate length "Lg" is 0.25 µm or less.

5. The terahertz wave radiating element of claim 1, wherein a finger length of the plurality of ohmic fingers is equal to a gate length of the gate electrode.

6. The terahertz wave radiating element of claim 1, wherein:
a finger length of the plurality of ohmic fingers is equal to a gate length of the gate electrode, and
a distance between the gate electrode and one of those two of the plurality of ohmic fingers which are located close to both sides of the gate electrode is equal to a distance between the gate electrode and the other ohmic finger.

7. The terahertz wave radiating element of claim 1, wherein:
a finger length of the plurality of ohmic fingers is equal to a gate length of the gate electrode, and
a distance between adjoining ones of the plurality of ohmic fingers is equal to a distance between the gate electrode and each of those two of the plurality of ohmic fingers which are located close to both sides of the gate electrode.

8. The terahertz wave radiating element of claim 1, wherein a plurality of metal fingers, which are not electrically connected together, are periodically arranged between the gate electrode and one of the source and drain electrodes.

9. The terahertz wave radiating element of claim 1, wherein:
multiple ones of the terahertz wave radiating element are placed, and
the gate electrode and the source and drain electrodes of each of the terahertz wave radiating elements are connected to the gate electrode and the source and drain electrodes of the remainder of the terahertz wave radiating elements via an interconnect electrode.

10. The terahertz wave radiating element of claim 9, wherein:
the gate electrode is formed by a plurality of gate fingers that are arranged periodically, and
the gate fingers and the ohmic fingers are arranged alternately.

11. The terahertz wave radiating element of claim 1, further comprising:
a plurality of interconnect electrodes formed in a longitudinal direction of the plurality of ohmic fingers so as to contact the plurality of ohmic fingers.

12. The terahertz wave radiating element of claim 3, wherein a finger length of the plurality of ohmic fingers is equal to a gate length of the gate electrode.

13. The terahertz wave radiating element of claim 3, wherein:
a finger length of the plurality of ohmic fingers is equal to a gate length of the gate electrode, and
a distance between the gate electrode and one of those two of the plurality of ohmic fingers which are located close to both sides of the gate electrode is equal to a distance between the gate electrode and the other ohmic finger.

14. The terahertz wave radiating element of claim 3, wherein:
a finger length of the plurality of ohmic fingers is equal to a gate length of the gate electrode, and
a distance between adjoining ones of the plurality of ohmic fingers is equal to a distance between the gate electrode and each of those two of the plurality of ohmic fingers which are located close to both sides of the gate electrode.

15. The terahertz wave radiating element of claim 3, wherein a plurality of metal fingers, which are not electrically connected together, are periodically arranged between the gate electrode and one of the source and drain electrodes.

16. The terahertz wave radiating element of claim 3, wherein:
multiple ones of the terahertz wave radiating element are placed, and the gate electrode and the source and drain electrodes of each of the terahertz wave radiating elements are connected to the gate electrode and the source and drain electrodes of the remainder of the terahertz wave radiating elements via an interconnect electrode.

17. The terahertz wave radiating element of claim 16, wherein:

the gate electrode is formed by a plurality of gate fingers that are arranged periodically, and the gate fingers and the ohmic fingers are arranged alternately.

18. The terahertz wave radiating element of claim 3, further comprising:

a plurality of interconnect electrodes formed in a longitudinal direction of the plurality of ohmic fingers so as to contact the plurality of ohmic fingers.

* * * * *